United States Patent
Tews et al.

(10) Patent No.: US 6,396,081 B1
(45) Date of Patent: May 28, 2002

(54) LIGHT SOURCE FOR GENERATING A VISIBLE LIGHT

(75) Inventors: Helmut Tews, Poughkeepsie, NY (US); Robert Averbeck, Munich; Henning Riechert, Ottobrun, both of (DE)

(73) Assignee: Osram Opto Semiconductor GmbH & Co. OHG, Regensburg (DE)

(*) Notice: Subject to any disclaimer, the term of this patent is extended or adjusted under 35 U.S.C. 154(b) by 0 days.

(21) Appl. No.: 09/720,695

(22) PCT Filed: Jun. 25, 1999

(86) PCT No.: PCT/DE99/01860

§ 371 (c)(1),
(2), (4) Date: Apr. 2, 2001

(87) PCT Pub. No.: WO00/02261

PCT Pub. Date: Jan. 13, 2000

(30) Foreign Application Priority Data

Jun. 30, 1998  (DE) .................................... 198 292 082

(51) Int. Cl.$^7$ .............................................. H01L 27/15
(52) U.S. Cl. .............................. 257/79; 257/80; 438/22
(58) Field of Search ............................ 257/79, 89, 103, 257/80, 81, 82, 83, 84; 250/336.1, 336.2, 338.1, 338.4, 370, 370.14, 372

(56) References Cited

U.S. PATENT DOCUMENTS

| | | |
|---|---|---|
| 3,875,456 A | 4/1975 | Kano et al. |
| 5,679,965 A | 10/1997 | Schetzina |
| 6,084,250 A | 7/2000 | Jüstel et al. |
| 6,165,631 A | 12/2000 | Boerner et al. |

FOREIGN PATENT DOCUMENTS

| | | |
|---|---|---|
| DE | 196 38 667 | 4/1998 |
| DE | 197 56 360 | 9/1998 |
| DE | 198 00 983 | 12/1998 |
| EP | 0 722 249 | 5/1997 |
| EP | 0 817 282 | 6/1997 |
| WO | WO 97/48138 | 12/1997 |

OTHER PUBLICATIONS

Abstract of Japanese 09153645 (Jun. 10, 1997) *Patent Abstracts of Japan*.

Shibata et al, "GaN/BAIN heterostructure grown on a (0001)6H–SiC substrate by metalorganic vapor phase epitaxy", *Journal of Crystal Growth 189/90* (1998), pp. 445–447.

Sakai et al, "Band Gap Energy and Band Lineup of III–V Alloy Semiconductors Incorporating Nitrogen and Boron", *Jpn. J. Appl. Phys.*, vol. 32 (1993), pp. 4413–4417, Part 1, No. 10 Oct. 1993.

*Primary Examiner*—David Nelms
*Assistant Examiner*—Andy Huynh
(74) *Attorney, Agent, or Firm*—Schiff Hardin & Waite

(57) ABSTRACT

Light source (1) for generating visible light (200), comprising at least one diode (10) on a semiconductor basis emitting ultraviolet light (100) and at least one luminophor (20) into which the emitted ultraviolet light (100) beams and which generates the visible light from the emitted ultraviolet light (100).

Application: Generation of white light offering especially high color fidelity.

13 Claims, 1 Drawing Sheet

LIGHT SOURCE FOR GENERATING A VISIBLE LIGHT

BACKGROUND OF THE INVENTION

The invention relates to a light source for generating visible light, which is composed of a diode on a semiconductor basis or a semiconductor diode emitting light of a specific wavelength and of at least one luminophor into which the emitted light is directed and which luminophor generates visible light of another wavelength from the emitted light.

A light source of this type is known and is offered by Siemens AG located in Berlin and Munich under the trademark LUCO®. Given this light source, the diode is composed of a light diode, which emits blue light. The luminophor generates light in the yellow spectral range by absorption of the emitted blue light. The light outputted by this light source is white light, which results from the superimposition of the light generated in the yellow spectral range and a non-absorbed portion of the emitted blue light.

The known light source has a high efficiency, is constructionally simple, has small dimensions, is inexpensive and only requires a low operating voltage enabling battery operation.

A light source for generating visible light with the aid of a diode on a semiconductor basis is also known, which is composed of three light diodes, whereby a first one only emits the primary color red, a second one only the primary color green and a third one only the primary color blue. These three diodes are arranged, for example, in a housing such that the three emitted primary colors superimpose one another and thus generate white light. A luminophor is not necessary for this light source.

This light source is also highly efficient and only requires a low electrical operating voltage enabling battery operation. The intensities of the three primary colors, however, must be exactly matched to one another. For this reason and due to the necessity of three light diodes and an involved assembly technique, this light source is more involved and expensive compared to the light source of the first cited type.

Both light sources are constructionally simple and can be realized with small dimensions compared to a traditional luminophor lamp, wherein ultraviolet light having a wavelength of 253.7 nm is emitted from a discharge in gas, and which comprises at least one luminophor into which this emitted ultraviolet light beams and which generates visible light from this emitted ultraviolet light. The gas discharge of a luminophor lamp requires high electrical voltage and the dimensions of the lamp cannot downwardly transgress specific values due to constructional reasons. Luminophor lamps reach an efficiency of approximately 20%, which is high compared to the efficiency of approximately 4% of a conventional filament lamp.

Efficiency means the ratio of the optical performance outputted by the respective light source to the electrical performance utilized for generating this performance.

Given the conventional luminophor lamp, a luminophor can be used in the form of a mixture of different luminophor substances, each of which is activated at the wavelength 253.7 nm and respectively visible light of a wavelength having a spectrum composed of a plurality of wavelengths can be generated.

SUMMARY OF THE INVENTION

The invention is based on the object of providing a light source for generating visible light, whereby a significantly greater wealth of visible wavelengths and/or spectrums are available for forming a spectrum of the generated visible light.

This object is achieved by a light source comprising at least one semiconductor diode emitting ultraviolet light and at least one luminophor which generates visible light when the ultraviolet light is directed into the luminophor.

The inventive light source is a source of the aforementioned type, whereby, in contrast to the known light source of this type, the diode does not emit visible blue light but invisible ultraviolet light and whereby the luminophor generates the visible light from the emitted ultraviolet light and not from the emitted blue light.

The visible light generated by the inventive light source is advantageously free of a superimposition of light of a color and free of light of another color from a light diode.

Given the inventive light source, the generated visible light, similar to a conventional luminophor lamp, advantageously stems from the luminophor alone, since the ultraviolet light generated by the diode is invisible.

Advantageously, every arbitrary diode generating ultraviolet light-regardless of the wavelength-can be utilized with respect to the inventive light source. A luminophor must be selected, which is activated given the ultraviolet wavelength, which is generated by the respective diode. Essentially all ultraviolet wavelengths beyond the boundary to the visible violet, particularly the wavelengths of 150 nm to 400 nm, can be advantageously generated by the currently available diodes or by the diodes that will be available at lest in the near future, so that all these wavelengths, which particularly contain the wavelength 253.7 as well, are available to the inventive light source. Separate, particularly also new luminophors, can be used for each of these ultraviolet wavelengths, so that the palette of utilizable luminophors with respect to the inventive light source is much more versatile compared to the conventional luminophor lamp.

Given the conventional luminophor lamp, the ultraviolet light is limited to the very narrow-banded wavelength range (253.7 nm) of the gas discharge. Therefore, only luminophors that are activated at the wavelength 253.7 can be used for the lamp.

In particular, a far greater number of wavelengths and/or specturms of the outputted visible light can be advantageously realized with respect to the inventive light source than before, since not only the visible wavelengths and/or spectrums of the luminophors activated at the individual ultraviolet wavelength 253.7 nm but also the visible wavelengths and/or spectrums of the luminophors activated at the ultraviolet wavelengths that are different from 253.7 are available. The additional visible wavelengths and/or spectrums generated by the additionally available luminophors can advantageously differ greatly among one another and can differ greatly from the visible wavelengths generated by the luminophors that are activated at the individual ultraviolet wavelength 253.7 nm. Given the inventive light source, a considerably greater wealth of visible wavelengths and/or visible spectrums therefore is available for the generated visible light.

Similar to the conventional luminophor lamp, a luminophor in the form of a mixture and/or laminate composed of various luminophor substances, which are activated at one and the same ultraviolet wavelength and which, at this wavelength, can generate a plurality of visible wavelengths and/or spectrums, particularly various spectrums that are situated at a plurality of visible wavelengths, for example, which are available for forming a spectrum of the visible light outputted by the inventive light source, can be advantageously used given the inventive light source.

In contrast to the conventional luminophor lamp, wherein this possibility is limited to the individual ultraviolet wavelength 253.7 nm, this possibility is advantageously given for each individual wavelength of the ultraviolet range, particularly the range of 150 nm to 400 nm, given the inventive light source. Given the inventive light source, visible wavelengths and/or various spectrums situated at visible wavelengths can be generated dependent on the utilized mixtures and/or laminates composed of various luminophor substances but also dependent on the used ultraviolet wavelength, so that the inventive light source, compared to the conventional luminophor lamp, can output visible light of a spectrum, whereby a far greater versatility of visible wavelengths and/or visible spectrums is available for forming said visible light of a spectrum.

A laminate is composed of at least two layers arranged on top of one another, which layers are to be understood as substances that are different from one another.

In comparison with the conventional luminophor lamp, a special advantage of the inventive light source is that a plurality of ultraviolet wavelengths can be used at the same time. For this purpose, the inventive light source must only have a plurality of diodes, each of which emits ultraviolet light at another wavelength, and must have at least one luminophor, which is activated at this ultraviolet wavelength, for each of these ultraviolet wavelengths.

In contrast to the conventional luminophor lamp, wherein only luminophors or luminophors in the form of a mixture composed of various luminophor substances can be utilized, which can only be activated at a specific ultraviolet wavelength, it is possible with respect to the inventive light source to use individual luminophors and/or luminophors in the form of a mixture or laminate composed of various luminophor substances, which are activated at the same time at ultraviolet wavelengths that are different from one another and which can all contribute to the formation of a spectrum of the visible light outputted by the inventive light source. In this way, the wealth of visible wavelengths and/or spectrums—by means of which a spectrum of the visible light generated by the inventive light source can be composed—can be considerably increased once again.

A so composed visible spectrum can eclipse all visible spectrums concerning complexity and variation possibilities, which have been hitherto achieved by light sources composed of light-emitting diodes on a semiconductor basis and luminophor, and by a conventional luminophor lamp, and enables a spectrum design as desired. In particular, white light can be generated with a spectrum, which is equal to the spectrum of sunlight or which is at least very similar to it. White light, which offers a color fidelity that cannot be obtained by comparable light sources, can be generated.

Therefore, an advantageous embodiment of the inventive light source is composed of at least
 a diode on semiconductor basis, which emits ultraviolet light of a wavelength,
 a luminophor into which the emitted ultraviolet light of this wavelength beams and which generates visible light from this emitted light,
 a diode on semiconductor basis, which emits ultraviolet light of another wavelength, which is different from the one wavelength, and
 a luminophor into which the emitted ultraviolet light of the other wavelength beams and which generates visible light from this emitted light.

The luminophor activated by the ultraviolet light of a diode can basically be the same luminophor, which is activated by the ultraviolet light of the other diode, when it is a luminophor that is activated at two different wavelengths. However, it is more advantageous when a luminophor, into which ultraviolet light of a wavelength beams, differs from a luminophor into which ultraviolet light of another wavelength beams, which differs from the one wavelength.

Given a preferred embodiment of such a light source, a luminophor into which ultraviolet light of a wavelength beams, and a luminophor, which is different from this luminophor and into which ultraviolet light of another wavelength beams, which differs from the one wavelength, together form a mixture and/or laminate.

Since the ultraviolet light generated by each diode of the inventive light source is invisible, it has advantageously no color-falsifying influence on the visible light generated by the luminophor or luminophor mixture. It can be particularly avoided that white light generated by the inventive light source has a slight cast of yellow or blue dependent on the viewing angle.

A portion of the ultraviolet light generated by the diode can be advantageously simply filtered out by a plastic covering, which is impermeable for ultraviolet light, or by an assembly behind glass, which portion is not absorbed by the luminophor.

Advantageously, the inventive light source can generate white light with which objects of different color, such as lines in different colors on maps or city maps, can be better differentiated than with white light, which is generated by a known light source by superimposition of light of a color with light of another color from a light-emitting diode on a semiconductor basis.

This is based on the knowledge that white light having a line spectrum that is only composed of a few lines is disadvantageous for a differentiation of objects of different color. The last is the case, for example, when the white light is generated by superimposition of the three primary colors red, green and blue and when each of these primary colors is only composed of a narrow-banded spectral line. Objects of different color having a spectrum, which goes beyond the three narrow-banded spectral lines of the primary colors, can exhibit colors or color nuances, which are often difficult to differentiate or which can no longer be differentiated at all given illumination with white light that is only formed of the three narrow-banded spectral lines of the primary colors.

It has also been found that white light, which is formed by a superimposition of light from the yellow spectral range and which is formed by blue light, can be problematic for a differentiation of objects of different color-even though to a comparatively low degree.

The inventive light source can generate white light with one single diode, whereby objects of different color can be advantageously differentiated at least just as good with said white light as with white light generated by a conventional luminophor lamp.

In comparison with the known light source of the aforementioned type and also in comparison with the conventional luminophor lamp, the inventive light source advantageously has an efficiency that is just as high and, in comparison with the known light source, that is advantageously constructionally as simple, as small in its dimensions, as inexpensive and advantageously only requires low electrical operating voltage as well, which enables battery operation.

Given a preferred and advantageous embodiment of the inventive light source, a diode has an active layer, which emits the ultraviolet light and which is composed of a material on the basis of AlN and/or GaN. Depending on the content with respect to Al and/or Ga, all ultraviolet wavelengths, particularly the wavelengths in the range of 150 nm to 400 nm, can be basically realized by AlN and GaN and also with the aid of additives. $Al_xGa_{l-x}N$, $B_xAl_{l-x}N$, $B_xGa_{l-x}N$ and/or $B_xAl_{y-x}Ga_yN$ are particularly suitable. For example, the wavelength 200 nm can be realized with pure AlN.

While $Al_xGa_{l-x}N$ is already established with respect to diodes on a semiconductor basis or a semiconductor diode emitting ultraviolet light, the boronic nitrides $B_xAl_{l-x}N$, $B_xGa_{l-x}N$ and/or $B_xAl_{y-x}Ga_{l-y-x}N$ or known given such diodes. These boronic nitrides have the advantage that they can be grown on SIC substrates in a lattice-adapted fashion. The content with respect to B should be low compared to the content with respect to Al and/or Ga. A photon energy of 5.2 eV or, respectively, 6.6 eV can be expected for $B_xGa_{l-x}N$ and $B_xAl_{l-x}N$.

The wavelength 253.7 nm that is generated by the gas discharge of a conventional luminophor lamp and that corresponds to a photon energy of approximately 5 eV can be received given a light source comprising a semiconductor diode of an active layer selected from a group consisting of AlN, GaN, $Al_xGa_{l-x}N$, $B_xAl_{l-x}N$ and $B_yAl_{y-x}Ga_yN$, when an Al-containing material, which is used for the active layer, exhibits a content of Al of at least 50%. In this case, an inventive light source can be advantageously realized, which exhibits the same luminophors composed of individual luminophor substances or mixtures composed of a plurality of luminophor substances, the same optical properties and the same high efficiency as a conventional luminophor lamp, which, however, can be advantageously significantly smaller and can be operated by battery in contrast to this lamp.

Given this realization, all luminophors as they occur in conventional luminophor lamps can be advantageously used. These luminophors are advantageously inexpensive and are available in large quantities and have been optimized toward long longevity and high efficiency. The types that are currently available advantageously even enable a specific selection of the color temperature.

Moreover, new luminophors exhibiting new luminophor substances on an individual basis or in a mixture and/or laminate can be advantageously used with respect to the inventive light source. In order to generate the visible light, the selected luminophor and a wavelength of the ultraviolet light generated by the diode must be matched to one another, regardless of whether the luminophor is conventional or new.

Every luminophor that is used in conventional luminophor lamps is optimized for ultraviolet light, which is generated by excitation of a gas discharge. Optimized generally means with regard to a luminophor that the luminophor exhibits an absorption maximum at the wavelength at which it is to be activated. In the case of the conventional luminophor lamps, each optimized luminophor exhibits an absorption maximum at the wavelength 253.7 nm.

Given the inventive light source, an increase in efficiency can be advantageously expected as a result of the utilization of new luminophors, whose absorption maximum is situated in the close ultraviolet range. This also has the advantage that diodes, which emit ultraviolet light in the close ultraviolet range, i.e., close to the wavelength 400 nm, can be currently produced particularly simple.

In order to increase the efficiency of a diode emitting ultraviolet light, it is expedient when at least a layer composed of a chemical substance is arranged in addition to the active layer of the diode, whereby said chemical substance exhibits a larger energy gap compared to the chemical substance of the active layer. Such a diode is capable of increasing the efficiency of the entire source given an inventive light source. Therefore, it is advantageous when an inventive light source has a diode, wherein at least a layer composed of a chemical substance, which has a larger energy gap compared to the chemical substance of the active layer, is arranged at the active layer.

If the material of the active layer contains Al, the layer of the larger energy gap can be realized in that the layer of the larger energy gap is composed of an Al-containing material having a higher content with respect to Al compared to the material of the active layer.

If the material of the active layer contains B, the layer of the larger energy gap can be realized in that the layer of the larger energy gap is composed of a B-containing material having a higher content with respect to B compared to the material of the active layer.

A special embodiment of the inventive light source is characterized by a diode emitting ultraviolet light at a wavelength in the range of 150 nm to 320 and by a luminophor generating visible light within this range. A particularly preferred range of the wavelength of the ultraviolet light is situated at 200 nm to 270 nm.

The inventive light source is very simple in terms of construction; advantageously exhibits long longevity in addition to high efficiency; requires only low operating voltage of a few volt and can be miniaturized. Already established technologies can be advantageously utilized for its production.

The invention is subsequently explained in greater detail on the basis of the Figures.

DESCRIPTION OF THE PREFERRED EMBODIMENTS

Figure 1:
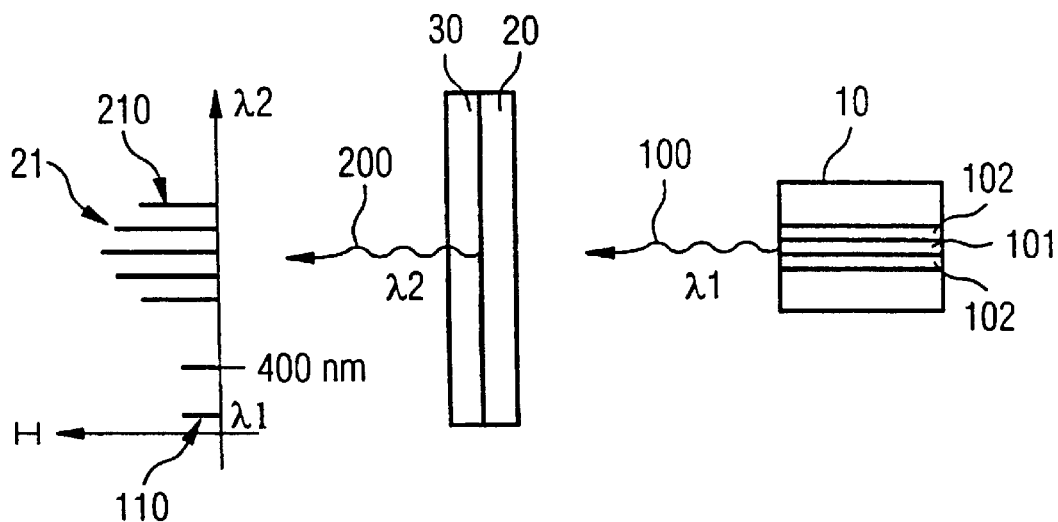
FIG. 1 is a schematic view of a first exemplary embodiment of the inventive light source.

The inventive light source 1 shown as an example in FIG. 1 comprises a semiconductor diode 10 and a luminophor 20. The diode emits ultraviolet light 100 of a wavelength $\lambda 1$. The emitted ultraviolet light 100 beams into the luminophor 20, and the luminophor 20 generates visible light 200 of a wavelength $\lambda 2$ from the emitted light.

The luminophor 20 can be composed of one single chemical luminophor substance. The visible light generated by one single chemical luminophor substance can exhibit a line spectrum or a comparably broad-banded continuous spectrum.

Visible or ultraviolet light generated by a traditional semiconductor diode always exhibits a line spectrum that is composed of one single spectral line.

The spectrum 110 of the ultraviolet light 100 emitted by the diode 10 at the wavelength $\lambda 1$ therefore is limited to an extremely narrow wavelength range containing the wavelength $\lambda 1$, i.e., the intensity I of the emitted ultraviolet light 100 is only different from zero in this narrow range, whereby a maximum of the intensity I is situated at the wavelength $\lambda 1$ itself. This spectrum 110 appears as one single line to the outside.

The spectrum 210 of visible light 200 emitted by a luminophor 20 composed of one single luminophor substance at the wavelength λ2 can be composed of a narrow spectral line or a broad-banded continuous spectrum and exhibits a maximum of the intensity I at the visible wavelength λ2.

Instead of a luminophor 20 that consists of one single luminophor substance, the light source I can also exhibit a luminophor 20, which is composed of two or more different luminophor substances into each of which the emitted ultraviolet light 100 beams.

Each luminophor substance generates visible light from this light 100 of a respective spectrum 210, which exhibits a maximum of the intensity I given a respectively different visible wavelength λ2.

The different luminophor substances can be spatially separated from one another; they preferably form a mixture and/or laminate. The ultraviolet wavelength λ1 beamed into the luminophor 20 in the form of the mixture and/or laminate, which is composed of a plurality of different luminophor substances, generates visible light 200 containing a plurality of spectrums 210.

Figure 2:
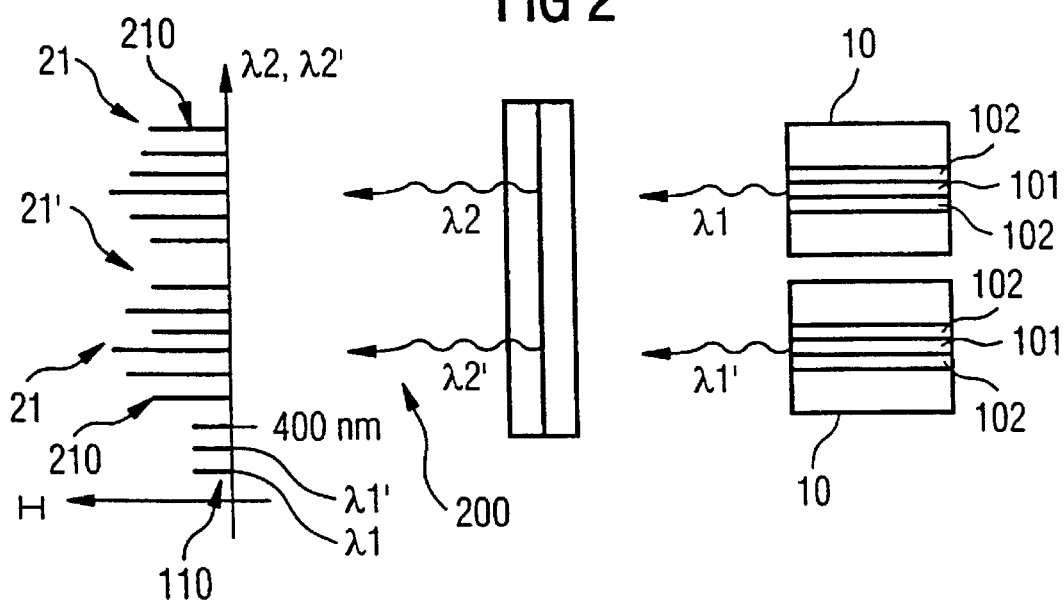
FIG. 2 is a schematic view of a second exemplary embodiment of the inventive light source.

In the FIGS. 1 and 2, each spectrum 210 is shown as respectively one line, which respectively represents one visible wavelength λ2, whereby this spectrum 210 exhibits a maximum of the intensity I there.

The individual spectrums 210 together yield in a new spectrum 21 of the visible light 200 emitted by the light source 1. On the basis of an appropriate selection of the different luminophor substances, the individual spectrums 210 can be selected according to spectral position and shape such that they together yield in a spectrum 21 for white light.

The luminophor substances of the luminophor or the luminophors 20 preferably consist of solids, which are deposited on a carrier 30 in the form of a layer, for example. The carrier is preferably composed of a material, which is permeable for the light 200 generated by the luminophor or luminophors 20 and which can be glass, for example.

The diode 10 comprises an active layer 101, which is composed of a material on the basis of AlN and/or GaN, preferably of $Al_xGa_{1-x}N$, $B_xAl_{1-x}N$, $B_xGa_{1-x}N$ and/or $B_xAl_{y-x}Ga_yN$, and which emits the ultraviolet light 100. The Al-containing materials preferably exhibit a content with respect to Al of at least 50%.

Given a concrete example, the active layer 101 of the diode 10 is composed of $Al_xGa_{1-x}N$ or $B_xAl_{y-x}Ga_yN$ with a content with respect to Al of 50% to 60%, whereby the content with respect to B is low compared to the content with respect to Al. In this active layer, a diode 20 can be realized, which emits ultraviolet light 100 at a wavelength λ1 in the range 150 nm to 320 nm, preferably 200 nm to 320 nm. The wavelength 253.7 nm, which is the wavelength of the ultraviolet light generated by the gas discharge of a conventional luminophor lamp, falls into this range.

Therefore, an inventive light source 1 can be realized, which advantageously is the exact inventive equivalent to a conventional luminophor lamp, when the diode 10 is dimensioned such that it emits ultraviolet light 100 at the wavelength 253.7 nm, and when a luminophor is used, which is utilized for the conventional luminophor lamp and which can be composed of one single luminophor substance or of a mixture and/or laminate composed of a plurality of luminophor substances. The inventive equivalent has the already cited considerable advantages vis-a-vis the conventional luminophor lamp.

Given the active layer 101, a layer 102 composed of a material that exhibits a larger energy gap compared to the material of the active layer 101 is respectively arranged specifically on each flat side of the active layer 101.

If the active layer 101 consists of an Al-containing material, the layer 102 of the larger energy gap can be composed of an Al-containing material exhibiting a higher content with respect to Al than the material of the active layer 101. If the active layer 101 consists of a B-containing material, the layer 102 of the larger energy gap can be composed of a B-containing material exhibiting a higher content with respect to B than the material of the active layer 101.

For example, the active layer 101 can be composed of $Al_xGa_{1-x}N$, $B_xAl_{1-x}N$ and/or $B_xAl_{y-x}Ga_yN$ and the layer 102 of the larger energy gap can also be composed of $Al_xGa_{1-x}N$, $B_xAl_{1-x}N$ and/or $B_xAl_{y-x}Ga_yN$, whereby the content with respect to Al of the material of the layer 101 is selected this much higher, compared to the active layer 101, that the layer 102 exhibits a larger energy gap than the active layer 101.

In the exemplary embodiment according to FIG. 1, the light source I only has one diode 10. This diode 10 generates ultraviolet light 100 of a wavelength λ1. If a luminophor 20 composed of one single luminophor substance is utilized, it generates visible light 200 from the ultraviolet light 100 of the wavelength λ1, whereby said visible light 200 has a spectrum 210 at a visible wavelength λ2.

If, on the other hand, a luminophor 20 is used in the form of a mixture and/or laminate composed of two or more different luminophor substances such that each luminophor substance generates visible light of the spectrum 210 from the emitted ultraviolet light 100 of the wavelength λ1 at a different respective wavelength λ, so that the wavelengths λ2 generated by different luminophor substances are different form one another, the visible light 200 emitted by the light source 1 contains a spectrum 21, which is composed of a number of spectrums, which are situated at the different visible wavelengths λ2, whereby the number of spectrums 210 is equal to the number of different luminophor substances of the mixture and/or laminate. The spectrum 21 can be composed of a plurality of individual spectral lines, of one or more continuous spectrums or of a mixture composed of one or more individual spectral lines and of one or more continuous spectrums.

The spectrum 21 composed of the number of spectrums 210, which are situated at different visible wavelengths λ2, can be individually adjusted to the extent that the maximum of the intensity I of each individual spectrum 210 situated at a visible wavelength λ2 can be adjusted in that the portion of the individual luminophor substance generating this spectrum 210 can be modified with respect to the mixture or laminate within specific boundaries.

In this way, visible particularly white light 200 can be generated, which at least has the quality of the visible light of a conventional luminophor lamp. In contrast to the conventional luminophor lamp, there is the advantage that the activating ultraviolet wavelength λ1 can be freely selected in a large wavelength range.

The exemplary embodiment according to FIG. 2 essentially differs from the example according to FIG. 2 in that the light source 1', in addition to the diode 10, comprises a diode 10' emitting ultraviolet light 100' of a further wavelength λ1', which is different from the wavelength λ1. Moreover, the light source 1' has a luminophor 20 into which the ultraviolet light 100' of the wavelength λ1' beams and which, from this emitted light 100', generates visible light of a spectrum 210' having a maximum of the intensity I given a visible wavelength λ2', which is different from the visible wavelength $\lambda 2$. The visible light 200 outputted by this light source 1' therefore contains at least a spectrum 210, whose maximum of the intensity I is situated at the visible wavelength $\lambda 2$, and contains at least a spectrum 210', whose maximum of the intensity I is situated at the visible wavelength $\lambda 2$ .

The light source 1', in addition to the diode 10 emitting the ultraviolet light of the wavelength $\lambda 1$, can also comprise two or more diodes 10', each of which emits ultraviolet light 100' at respectively another wavelength $\lambda 1'$, so that the wavelengths $\lambda'$, which are emitted by different diodes 10', are different from one another. In this case, the light source 1' is to comprise a luminophor 20 for each of the different ultraviolet wavelengths $\lambda 1$ and $\lambda'$, whereby this ultraviolet wavelength $\lambda 1$ or, respectively, $\lambda 1'$ beams therein and which luminophor 20 generates visible light of a wavelength $\lambda 2$ or, respectively, $\lambda 2'$ from this wavelength $\lambda 1$ or, respectively, $\lambda 1'$-preferably such that the spectrums 210, 210' generated by different ultraviolet wavelengths $\lambda 1$ or, respectively, $\lambda 1'$ have a maximum of the intensity I at different visible wavelengths $\lambda 2$ or, respectively, $\lambda 2'$. The visible light 200 outputted by this light source 1 contains a spectrum 210 in this case, which has a maximum of the intensity I at the visible wavelength $\lambda 2$ and contains a plurality of spectrums 210' with respectively a maximum of the intensity I, which is situated at the two or more wavelengths $\lambda 2'$ that are different from one another.

A luminophor 20 that is composed of one single chemical substance can be basically present for the ultraviolet wavelengths $\lambda 1$, $\lambda 1'$, which are different from one another, provided that the substance exhibits the property of being activated at each of these wavelengths $\lambda 1$, $\lambda 1'$. This cannot always be realized.

It is more advantageous when an individually allocated luminophor 20 is used for each of the different ultraviolet wavelengths $\lambda 1$, $\lambda 1'$. The luminophors 20 can be selected independently of one another in this case, so that there are considerably more possibilities for realizing spectrums 210, 210' at visible wavelengths $\lambda 2$, $\lambda 2'$, which are contained in the light 200 emitted by the light source 1'.

In particular, an individually allocated luminophor 20 can be used, for at least one of the different ultraviolet wavelengths $\lambda 1$, $\lambda 1'$, in the form of a mixture and/or laminate, which is composed of a number of two or more different luminophor substances, each of which is only activated by this ultraviolet wavelength and which together generate a spectrum 21 from the same number of spectrums 210, which are situated at different visible wavelengths. This spectrum 21 is allocated to this ultraviolet wavelength and to this luminophor 20 alone. The light 200 outputted by the light source 1' contains this spectrum 21.

If a respectively individually allocated luminophor 20 is used respectively in the form of one of the mixture and/or laminate allocated alone to this wavelength for each of the different ultraviolet wavelengths $\lambda 1$, $\lambda 1'$, whereby said mixture and/or laminate is composed of a number of two or more different luminophor substances, each of which is only activated by this ultraviolet wavelength and which generate a same number of spectrums 210 together at different visible wavelengths, which together form a spectrum 21, which is allocated alone to this respective ultraviolet wavelength and this respective luminophor 20—the visible light 200 outputted by the light source 1 is composed of a number of such spectrums 21, which is equal to the given number of the different ultraviolet wavelengths $\lambda 1$, $\lambda 1'$.

This has the special advantage that each individual spectrum 21 can be individually adjusted within specific boundaries.

Visible light 200 that is generated by the light source 1 and that contains these spectrums 21 has a super spectrum 21' composed of one of these spectrums 21, whereby the complexity and variation possibility of said super spectrum 21' exceeds all spectrums by far, which have been hitherto obtained by means of light sources that are composed of a light-emitting diode on a semiconductor basis and luminophor and by means of conventional luminophor lamps, and which offers a spectrum design as desired.

The two or more diodes 10, 10' of the light source 1' according to FIG. 2 can be separately arranged from one another or can be arranged on a common substrate (not shown) such that, for example, they act as one single diode 10, which emits ultraviolet light 100 having a line spectrum composed of a plurality of different ultraviolet wavelengths $\lambda 1$, $\lambda 1'$.

Since the luminophors 20 individually allocated to the different ultraviolet wavelengths $\lambda 1$, $\lambda 1'$ can together form one single mixture and/or laminate, the light source 1' according to FIG. 2 can also be miniaturized, whereby all other mentioned advantages of the inventive light source are kept.

What is claimed is:

1. A light source for generating visible light, comprising at least one semiconductor diode emitting ultraviolet light and at least one luminophor which receives the emitted ultraviolet light and which generates the visible light from the emitted ultraviolet light, the diode having an active layer of a material selected from a group consisting of $B_xAl_{1-x}N$ and $B_xAl_{y-x}Ga_yN$, whereby x>0 and the Al content is between 50% and 60%.

2. A light source according to claim 1, wherein at least one layer, which is composed of a material having a larger energy gap compared to the material of the active layer, is arranged at the active layer.

3. A light source according to claim 2, wherein the active layer is composed of an Al-containing material and the layer of the larger energy gap is composed of an Al-containing material, which has a higher content with respect to Al than the material of the active layer.

4. A light source according to claim 2, wherein the active layer is composed of a B-containing material and the layer of the larger energy gap is composed of a B-containing material, which has a higher content with respect to B than the material of the active layer.

5. A light source according to claim 1, wherein the diode emits ultraviolet light having a wavelength in a range of 150 nm to 320 nm, and the luminophor generates light from the ultraviolet light of this wavelength.

6. A light source for generating a composed secondary-color spectrum of visible light, comprising a semiconductor diode, which emits ultraviolet light of one wavelength, a luminophor which receives the emitted ultraviolet light of the one wavelength and which generates visible light from the emitted light, a second semiconductor diode, which emits ultraviolet light of another wavelength, which is different from the one wavelength, and a second luminophor which receives the emitted ultraviolet light of the other wavelength and which generates visible light from this emitted light.

7. A light source according to claim 6, wherein the second luminophor is different from the first-mentioned luminophor.

8. A light source according to claim 7, wherein the first-mentioned luminophor and the second luminophor form a mixture.

9. A light source according to claim 7, wherein the first-mentioned luminophor and the second luminophor form a laminate of layers.

10. A light source according to claim 6, wherein an active layer of each diode has a material, which is selected from the group composed of $B_xAl_{1-x}N$ and $B_xAl_{y-x}Ga_yN$, whereby x>0 and the Al content is at least 50%.

11. A light source according to claim 10, wherein an Al-containing chemical substance has a content with respect to Al of 50% to 60%.

12. A light source according to claim 10, wherein at least one layer, which is composed of a material having a larger energy gap than the material of the active layer, is arranged at the active layer.

13. A light source according to claim 6, wherein one of the diodes emits ultraviolet light having a wavelength in a range of 150 nm to 320 nm and one of the luminophors generates white light from ultraviolet light in said range.

* * * * *